(12) United States Patent
Ban et al.

(10) Patent No.: US 11,768,403 B2
(45) Date of Patent: Sep. 26, 2023

(54) BACKLIGHT ASSEMBLY, MANUFACTURING METHOD THEREOF, AND DISPLAY DEVICE

(71) Applicant: BOE TECHNOLOGY GROUP CO., LTD., Beijing (CN)

(72) Inventors: Shengguang Ban, Beijing (CN); Zhanfeng Cao, Beijing (CN); Ke Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 379 days.

(21) Appl. No.: 16/958,564

(22) PCT Filed: Dec. 11, 2019

(86) PCT No.: PCT/CN2019/124537
§ 371 (c)(1),
(2) Date: Jun. 26, 2020

(87) PCT Pub. No.: WO2020/140703
PCT Pub. Date: Jul. 9, 2020

(65) Prior Publication Data
US 2021/0223631 A1    Jul. 22, 2021

(30) Foreign Application Priority Data

Jan. 2, 2019    (CN) .......................... 201910001165.3

(51) Int. Cl.
*H01L 33/00* (2010.01)
*G02F 1/1335* (2006.01)
(Continued)

(52) U.S. Cl.
CPC .. *G02F 1/133612* (2021.01); *G02F 1/133603* (2013.01); *G02F 1/133608* (2013.01); *H01L 25/0753* (2013.01); *H01L 33/62* (2013.01)

(58) Field of Classification Search
CPC ......... G02F 1/133612; G02F 1/133603; G02F 1/133608; G02F 1/133601; H01L 25/0753; H01L 33/62; H01L 33/60
See application file for complete search history.

(56) References Cited

U.S. PATENT DOCUMENTS 6,225,139 B1     5/2001  Tsung-Wen
11,557,489 B2 *  1/2023  Jain ..................... H01L 23/5389
(Continued)

FOREIGN PATENT DOCUMENTS

CN    101963336 A    2/2011
CN    107768358 A    3/2018
(Continued)

*Primary Examiner* — Ismail A Muse
(74) *Attorney, Agent, or Firm* — Nath, Goldberg & Meyer; Joshua B. Goldberg

(57) ABSTRACT

A backlight assembly, a manufacturing method thereof, and a display device are provided. The backlight assembly includes: a substrate, an anode trace and a cathode trace of an LED on the substrate, a planarization layer on a layer where the anode trace and the cathode trace of the LED are located, and an anode connection pad and a cathode connection pad on the planarization layer. The anode trace of the LED is coupled to the anode connection pad through a first via hole penetrating through the planarization layer, and the cathode trace of the LED is coupled to the cathode connection pad through a second via hole penetrating through the planarization layer. An exhaust channel is further arranged on the planarization layer to discharge gas accumulated in the planarization layer.

17 Claims, 4 Drawing Sheets

(51) Int. Cl.
*G02F 1/13357* (2006.01)
*H01L 25/075* (2006.01)
*H01L 33/62* (2010.01)

(56) References Cited

U.S. PATENT DOCUMENTS

| | | | |
|---|---|---|---|
| 2021/0020726 A1* | 1/2021 | Woo | H01L 27/3276 |
| 2021/0091275 A1* | 3/2021 | Chen | H01L 33/50 |
| 2021/0210474 A1* | 7/2021 | Ikeda | H01L 25/167 |
| 2022/0037297 A1* | 2/2022 | Lu | H01L 27/1259 |
| 2022/0298947 A1* | 9/2022 | Kasai | F01N 3/2828 |
| 2023/0064493 A1* | 3/2023 | McLaurin | G02B 19/0057 |

FOREIGN PATENT DOCUMENTS

| | | |
|---|---|---|
| CN | 207181893 U | 4/2018 |
| CN | 108828841 A | 11/2018 |
| CN | 109031779 A | 12/2018 |
| CN | 109597245 A | 4/2019 |
| CN | 209086622 U | 7/2019 |
| KR | 20060000562 A | 1/2006 |

* cited by examiner

BACKLIGHT ASSEMBLY, MANUFACTURING METHOD THEREOF, AND DISPLAY DEVICE

CROSS-REFERENCE TO RELATED APPLICATIONS

This is a National Phase Application filed under 35 U.S.C. 371 as a national stage of PCT/CN2019/124537, filed Dec. 11, 2019, an application claiming the benefit of Chinese Application No. 201910001165.3, filed Jan. 2, 2019, the content of each of which is hereby incorporated by reference in its entirety.

TECHNICAL FIELD

The present disclosure relates to the field of display technology, and particularly relates to a backlight assembly, a manufacturing method thereof, and a display device.

BACKGROUND

During displaying information performed by an existing display device such as a TV (television) of a large size, a large division (or region) composed of several or dozens of LEDs (light-emitting diodes) is generally used for displaying, and such divisional (or regional) display is a scheme commonly used for backlight divisional display.

SUMMARY

In some embodiments, a backlight assembly is provided, which includes: a substrate; an anode trace and a cathode trace of an LED on the substrate; a planarization layer on a layer where the anode trace and the cathode trace of the LED are located; and an anode connection pad and a cathode connection pad on the planarization layer, wherein the anode trace of the LED is coupled to the anode connection pad through a first via hole penetrating through the planarization layer, and the cathode trace of the LED is coupled to the cathode connection pad through a second via hole penetrating through the planarization layer, and wherein an exhaust channel is further arranged on the planarization layer to release gas accumulated in the planarization layer.

Optionally, the backlight assembly further includes: an auxiliary structure in a layer where the anode connection pad and the cathode connection pad are located, wherein the auxiliary structure includes a first component and a second component sequentially arranged along a direction away from the substrate, the first component of the auxiliary structure has a bottom surface proximal to the substrate, an orthographic projection of the bottom surface of the second component of the auxiliary structure on the substrate covers an orthographic projection of the first component of the auxiliary structure on the substrate; and a passivation layer on the anode connection pad, the cathode connection pad and a layer where the auxiliary structure is located, wherein an LED accommodating part is arranged in the passivation layer, and the LED accommodating part exposes the anode connection pad and the cathode connection pad; and the passivation layer, the bottom surface of the second component of the auxiliary structure, and the first component of the auxiliary structure define the exhaust channel.

Optionally, the anode connection pad and the cathode connection pad each include: a first component and a second component sequentially arranged along a direction away from the substrate, wherein the first component of the anode connection pad, the first component of the cathode connection pad and the first component of the auxiliary structure are arranged in a same layer and include a same material; and the second component of the anode connection pad, the second component of the cathode connection pad and the second component of the auxiliary structure are arranged in a same layer and include a same material.

Optionally, a material of the second component of the auxiliary structure includes Cu, and a material of the first component of the auxiliary structure includes MoNb.

Optionally, the backlight assembly includes a display region and an IC bonding region, wherein the auxiliary structure is located in the IC bonding region, and the anode connection pad and the cathode connection pad are located in the display region.

Optionally, the backlight assembly further includes an LED connection line in a same layer as the anode connection pad, the cathode connection pad and the auxiliary structures, wherein the auxiliary structure do not intersect the LED connection line.

Optionally, the backlight assembly further includes a reflection layer on the passivation layer.

Optionally, the backlight assembly further includes a passivation layer on a layer where the anode connection pad and the cathode connection pad are located, and a reflection layer on the passivation layer, wherein the backlight assembly further includes an LED accommodating part penetrating through the passivation layer and the reflecting layer, and an opening penetrating through the reflecting layer, wherein the LED accommodating part exposes the anode connection pad and the cathode connection pad; and the opening penetrating through the reflection layer serves as the exhaust channel.

Optionally, the backlight assembly further includes a passivation layer on a layer where the anode connection pad and the cathode connection pad are located, and a reflection layer on the passivation layer; the backlight assembly further includes an LED accommodating part and an opening each of which penetrates through the passivation layer and the reflection layer, wherein the LED accommodating part exposes the anode connection pad and the cathode connection pad, and the opening penetrating through the passivation layer and the reflection layer serves as the exhaust channel.

Optionally, the opening includes a plurality of openings which are uniformly arranged.

Optionally, the backlight assembly further includes a protection electrode covering a side of the anode connection pad distal to the substrate and a side of cathode connection pad distal to the substrate.

Optionally, the backlight assembly further includes a first protection layer between the planarization layer and the layer where the cathode trace and the anode trace are located.

Optionally, the backlight assembly further includes a second protection layer on the reflection layer.

Optionally, the backlight assembly further includes a reverse stress layer between the layer where the cathode trace and the anode trace are located and the substrate.

Optionally, each of the anode trace and the cathode trace of the LED includes a first MoNb layer, a Cu layer and a second MoNb layer sequentially arranged on the substrate.

Optionally, the first component has a smaller size than the second component in a direction perpendicular to a stacking direction of the first component and the second component.

In some embodiments, a manufacturing method for a backlight assembly is provided, which includes: forming a pattern including an anode trace and a cathode trace of an LED on a substrate by a patterning process; forming a planarization layer on a layer where the anode trace and the cathode trace of the LED are located, and forming a first via hole and a second via hole in the planarization layer; forming a pattern including an anode connection pad and a cathode connection pad on the planarization layer by a patterning process, wherein the anode trace of the LED is coupled to the anode connection pad through the first via hole penetrating through the planarization layer, and the cathode trace of the LED is coupled to the cathode connection pad through the second via hole penetrating through the planarization layer; and forming an exhaust channel on the planarization layer to discharge gas accumulated in the planarization layer.

Optionally, an auxiliary structure is further formed at the same time as the anode connection pad and the cathode connection pad are formed, the auxiliary structure including a first component and a second component sequentially arranged along a direction away from the substrate, wherein the second component of the auxiliary structure has a bottom surface proximal to the substrate, an orthographic projection of the bottom surface of the second component of the auxiliary structure on the substrate covers an orthographic projection of the first component of the auxiliary structure on the substrate; the method further includes forming a passivation layer after forming the anode connection pad, the cathode connection pad, and the auxiliary structure, wherein an LED accommodating part is formed in the passivation layer, and the LED accommodating part exposes the anode connection pad and the cathode connection pad; and the passivation layer, the bottom surface of the second component of the auxiliary structure, and the first component of the auxiliary structure define the exhaust channel.

Optionally, after forming the anode connection pad and cathode connection pad, the method further includes: sequentially forming a passivation layer and a reflection layer; and forming a pattern including an LED accommodating part penetrating through the passivation layer and the reflection layer and an opening penetrating through the reflection layer by a one-step patterning process, wherein the LED accommodating part exposes the anode connection pad and the cathode connection pad, and the opening penetrating through the reflection layer serves as the exhaust channel.

Optionally, after forming the anode connection pad and cathode connection pad, the method further includes: sequentially forming a passivation layer and a reflection layer, and forming a pattern including an LED accommodating part and an opening each of which penetrates through the passivation layer and the reflection layer by a one-step patterning process, wherein the LED accommodating part exposes the anode connection pad and the cathode connection pad, and the opening penetrating through the passivation layer and the reflection layer serves as the exhaust channel.

In some embodiments, a display device is provided, which includes the backlight assembly in above embodiments and a display panel, wherein the display panel includes a black matrix, and an orthogonal projection of the opening penetrating through the passivation layer and the reflection layer or an orthogonal projection of the opening penetrating through the reflection layer on the display panel falls into an orthogonal projection of the black matrix on the display panel.

DETAILED DESCRIPTION

Figure 1:
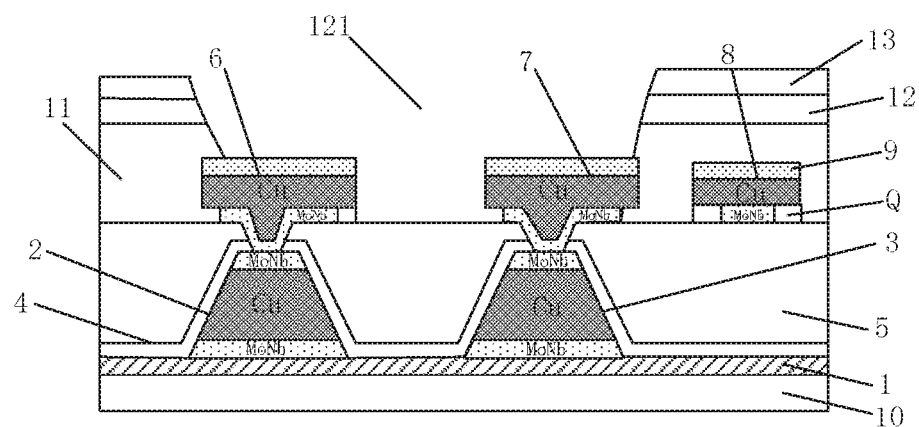
FIG. 1 is a schematic diagram of a structure of a backlight assembly according to an embodiment of the present disclosure.

In order to enable one of ordinary skill in the art to better understand technical solutions of the present disclosure, the present disclosure will be described in further detail with reference to the accompanying drawings and exemplary embodiments.

The inventors of the present inventive concept found that the currently adopted divisional display scheme for a backlight has a low display contrast due to an inherent disadvantage of a liquid crystal display. The low display contrast of the liquid crystal display is also the major disadvantage of an LCD (Liquid Crystal Display) compared with an OLED (Organic Light Emitting Diode) display device.

The most direct and effective method for improving the contrast of an LCD of a large size is to perform divisional control on the backlight of the LCD. That is, when a black image needs to be displayed on a division (or a region), the backlight in the division (or the region) is turned off, so that an absolute black may be realized in the division (or the region). In addition, the divisional control of the backlight also has a great advantage in HDR (high resolution display) display. In the related art, a backlight device is generally fabricated on a PCB (printed circuit board) in a backlight divisional control scheme, which results in a high cost and a great thickness of a backlight assembly. Therefore, it is desirable to find out a new scheme to replace the existing scheme. For example, it is desirable to develop a Mini LED scheme for backlight division on a glass substrate to greatly enhance the display effect of the LCD.

According to an embodiment of the present disclosure, a backlight assembly is provided, which may be applied to a liquid crystal display device. The backlight assembly includes a substrate, an anode trace (i.e., anode wiring) and a cathode trace (i.e., cathode wiring) of an LED on the substrate, a planarization layer on a layer where the anode trace and the cathode trace of the LED are located, and an anode connection pad and a cathode connection pad on the planarization layer. The anode trace of the LED is coupled to the anode connection pad through a first via hole penetrating through the planarization layer, and the cathode trace of the LED is coupled to the cathode connection pad through a second via hole penetrating through the planarization layer. In addition, an exhaust channel is provided on the planarization layer to discharge gas accumulated in the planarization layer.

It should be noted that, firstly, the LED adopted in the embodiment may be a mini LED, and a large current may be required for driving a mini LED device, so that the anode trace and the cathode trace for driving the mini LED are formed to have a larger width and a larger thickness. In this way, since the anode trace and the cathode trace are spaced apart from each other, the planarization layer formed on the anode trace and the cathode trace may have a larger thickness in order to fill the height difference therebetween. Next, a passivation layer may be provided on the anode and cathode connection pads of the LED, and an LED accommodating part may be formed in the passivation layer, with the anode and cathode connection pads exposed at a position of the LED accommodating part, so that an LED device may be bonded to the anode and cathode connection pads. A reflection layer may be provided on the passivation layer to reflect light emitted from the LED to improve light extraction efficiency of the LED. The reflection layer is usually disconnected at the position corresponding to the LED accommodating part (i.e., no reflection layer is provided at the position corresponding to the LED accommodating part), and the reflection layer at the other positions is usually of one-piece structure.

Since the planarization layer releases gas during an operation of the backlight assembly, the reflection layer is likely to bulge (e.g., to protrude up locally). In the present embodiment, the exhaust channel is provided on the planarization layer to guide the gas released (or discharged) from the planarization layer out of the backlight assembly, so that the bulging of the reflection layer can be effectively avoided, and the light reflected by the reflection layer is uniform. Therefore, the light provided by the backlight assembly according to the present embodiment is uniform, and a display device including the backlight assembly may display uniformly.

As shown in FIGS. 1, 2 and 4a to 4g, in some embodiments, a backlight assembly is provided, which includes a substrate 10, an anode trace 2 and a cathode trace 3 of an LED on the substrate 10, a planarization layer 5 on a layer where the anode trace 2 and the cathode trace 3 of the LED are located, an anode connection pad 6 and a cathode connection pad 7 on the planarization layer 5, and an auxiliary structure 8. The anode trace 2 of the LED is coupled to the anode connection pad 6 through a first via hole 51 penetrating through the planarization layer 5, and the cathode trace 3 of the LED is coupled to the cathode connection pad 7 through a second via hole 52 penetrating through the planarization layer 5. Further, the auxiliary structure 8 includes a first component and a second component arranged in sequence in a direction away from the substrate 10, and an orthographic projection of the second component of the auxiliary structure 8 on the substrate 10 covers (e.g., completely covers) an orthographic projection of the first component of the auxiliary structure 8 on the substrate 10. In other words, in a direction perpendicular to a stacking direction (e.g., the vertical direction in FIG. 1) of the first component and the second component, the first component has a size smaller than that of the second component, so that an undercut structure is formed below the second component. For example, as shown in FIG. 1, the first component may be a MoNb layer, and the second component may be a Cu layer. A hollowed-out space is formed below the second component and at one or more sides of the first component to serve as one or more exhaust channels (may also be referred to as exhaust passages or gas-discharge channels) Q. Each exhaust channel Q may or may not extend to the outside of the backlight assembly. For example, each exhaust channel Q may extend to the outside of the backlight assembly through a via hole or an opening at the periphery thereof. In a case where each exhaust channel Q extends to the outside of the backlight assembly, the bulging of the reflection layer 12 can be completely prevented. In a case where each of the exhaust channels Q does not extend to the outside of the backlight assembly, the bulging of the reflection layer 12 can be at least reduced, and in a case where the amount of gas generated in the planarization layer 5 is small, the bulging of the reflection layer 12 can be avoided. A passivation layer 11 is provided on a layer where the anode connection pad 6, the cathode connection pad 7 and the auxiliary structure 8 are located. The passivation layer 11 has an LED accommodating part 121 therein, and the anode connection pad 6 and the cathode connection pad 7 of the LED are exposed at the position of the LED accommodating part 121 for bonding an LED device (in other words, the anode connection pad 6 and the cathode connection pad 7 may be coupled to the anode and the cathode of the LED device, respectively). In this case, the exhaust channel(s) Q for releasing the gas accumulated in the planarization layer 5, i.e. for guiding the gas released from the planarization layer 5 out of the backlight assembly, is (are) defined by the passivation layer 11, the bottom surface of the second component of the auxiliary structure 8 (i.e., the surface of the second component proximal to the substrate 10), and the first component of the auxiliary structure 8. A reflection layer 12 is provided on the passivation layer 11, and the reflection layer 12 has an opening therein at a position corresponding to the LED accommodating part 121 (in other words, the LED accommodating part 121 penetrates through the reflection layer 12 and the passivation layer 11) to reflect light emitted from the LED device. For example, the reflection layer 12 may reflect light emitted from the LED devices coupled to the anode connection pads 6 and the cathode connection pads 7 toward the upper side shown in FIG. 1 to improve the light extraction efficiency of the backlight assembly.

Optionally, each of the anode connection pad 6 and the cathode connection pad 7 also includes a first component and a second component arranged sequentially in a direction away from the substrate 10. The first component of the anode connection pad 6, the first component of the cathode connection pad 7 and the first component of the auxiliary structure 8 are arranged in a same layer and made of a same material, and the material of the three components may be MoNb. The second component of the anode connection pad 6, the second component of the cathode connection pad 7 and the second component of the auxiliary structure 8 are arranged in a same layer and made of a same material, and the material of the three components may be Cu. Thus, the anode connection pad 6, the cathode connection pad 7 and the auxiliary structure 8 can be prepared by one-step patterning process, so that the process cost is not increased. Further, it is also possible to form an undercut structure (as shown in FIG. 1) under the second component of each of the anode connection pad 6 and the cathode connection pad 7 and at one or more sides of the corresponding first component, thereby forming more exhaust channels Q and further improving the exhaust effect (i.e., gas-discharge effect).

Figure 2:
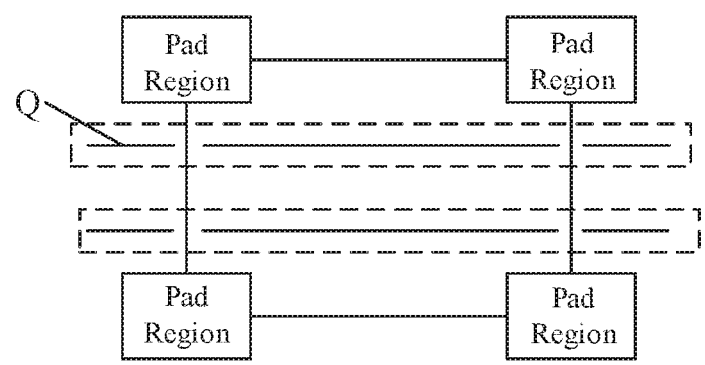
FIG. 2 is a schematic diagram illustrating a positional relationship between a pad region and an exhaust channel of an LED device according to an embodiment of the present disclosure.

It should be noted that, FIG. 2 shows a positional relationship between pad regions of LED devices and exhaust channels Q. Generally, two (or more) LED devices arranged adjacently are connected in series to form an LED string, and LED strings are connected in parallel. In this case, if the auxiliary structure 8 extends along a direction (e.g., the horizontal direction in FIG. 2), the auxiliary structure 8 may be short-circuited with a parallel connection line of the LED strings (e.g., a vertical line connecting two pad regions in FIG. 2). It will be appreciated that the auxiliary structures 8 for forming the exhaust channels Q is spaced apart from each parallel connection line of the LED strings are spaced apart from each other at locations where the auxiliary structure 8 and the parallel connection line are close to each other. That is, the auxiliary structure 8 may be arranged not to intersect with each LED connection line (e.g., the vertical line connecting two pad regions in FIG. 2), and the gas released from the planarization layer 5 may be discharged as long as the overall extending direction of the auxiliary structure 8 is directed to the outside of the backlight assembly.

Optionally, the backlight assembly may include a display region (i.e., a region where the LED devices are to be arranged) and an IC (integrated circuit) bonding region (e.g., a right region as shown in FIG. 1). The auxiliary structure 8 is located in the IC bonding region, and the anode connection pad 6 and the cathode connection pad 7 are located in the display region, so as not to affect the light extraction efficiency of the backlight assembly.

Optionally, a protection electrode 9 is further provided on the anode connection pad 6 and the cathode connection pad 7. Specifically, the protection electrode 9 is arranged between the second component of the anode connection pad 6 and the passivation layer 11, and between the second component of the cathode connection pad 7 and the passivation layer 11, to protect the anode connection pad 6 and the cathode connection pad 7 from corrosion by water and oxygen. Further, a material of the protection electrode 9 may be a transparent conductive material, for example, Indium Tin Oxide (ITO). Furthermore, a protection electrode 9 may be provided on a side of the auxiliary structure 8 distal to the substrate 10 to protect the auxiliary structure 8.

A first protection layer 4 may be further provided between the planarization layer 5 and the layer where the anode trace 2 and the cathode trace 3 are located, so as to prevent the gas released by the planarization layer 5 from oxidizing the anode trace 2 and the cathode trace 3. Specifically, silicon nitride (SiNx) may be used as a material of the protection layer 4. Each of the anode trace 2 and the cathode trace 3 optionally adopt a composite structure of three layers of MoNb/Cu/MoNb. Alternatively, a material of each of the anode trace 2 and the cathode trace 3 is not limited to thereto, and a conductive material such as Cu may be used.

A reverse stress layer 1 may be further provided between the layer where the anode trace 2 and the cathode trace 3 are located and the substrate 10. When the material of the anode trace 2 and the cathode trace 3 includes Cu, an internal stress of the Cu material layer is a tensile stress, and an internal stress of the reverse stress layer 1 is a compressive stress. The function of the reverse stress layer 1 includes, but is not limited to, preventing an edge of the Cu material layer from warping. For example, the material of the reverse stress layer 1 may include silicon nitride (SiNx).

Optionally, a second protection layer 13 is further provided on the reflection layer 12 to protect the reflection layer 12. For example, the reflection layer 12 may be made of silver (Ag), and in order to prevent the surface of the reflection layer 12 from being scratched and from reducing its reflectivity, the second protection layer 13 made of SiNx may be provided on the upper surface of the reflection layer 12.

Figure 3:
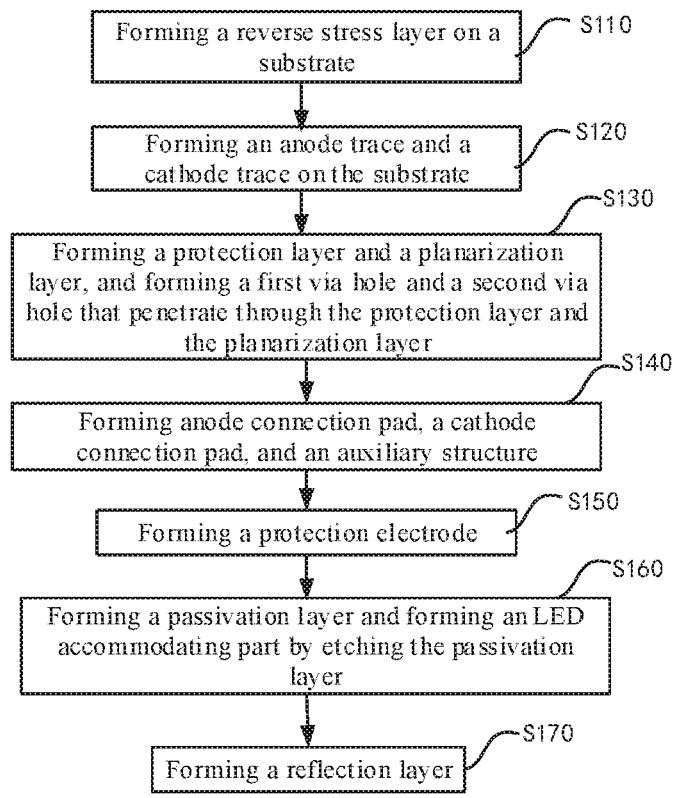
FIG. 3 is a flowchart of a manufacturing method for a backlight assembly according to an embodiment of the present disclosure.

A manufacturing method for the backlight assembly is provided in the embodiment of the present disclosure, as shown in FIG. 3. The method may include the following steps S10 to S170.

At step S110, a reverse stress layer 1 is formed on a substrate 10.

Figure 4A:
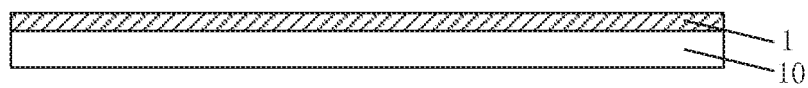
FIGS. 4a-4g are schematic diagrams of structures of a backlight assembly at stages of a manufacturing method for the backlight assembly according to an embodiment of the present disclosure.

For example, the reverse stress layer 1 may be a film layer having a compressive stress and made of silicon nitride (SiNx), with a thickness of 1000 Å-5000 Å, as shown in FIG. 4a.

At step S120, after the step S110 is completed, a pattern including an anode trace 2 and a cathode trace 3 is formed on the substrate 10 by a patterning process.

Figure 4B:
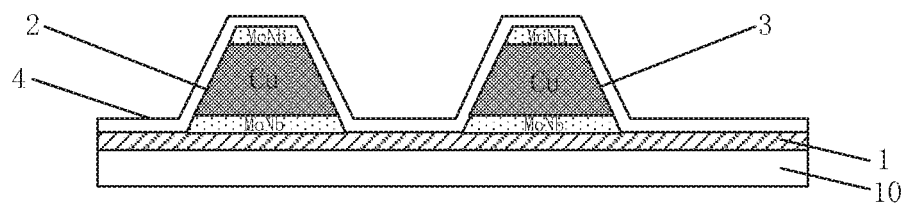

For example, each of the anode trace 2 and the cathode trace 3 may be a composite structure of three layers of MoNb/Cu/MoNb. When each of the anode trace 2 and the cathode trace 3 has the composite structure of three layers of MoNb/Cu/MoNb, step S120 may include: sequentially forming a MoNb material layer, a Cu material layer and a MoNb material layer; then forming a pattern including the anode trace 2 and the cathode trace 3 by exposure, development and etching, as shown in FIG. 4b. In this case, the functions of the MoNb material layer on each of the upper and lower surfaces of the Cu material layer are to increase the adhesion of the Cu material layer and prevent the oxidation of the Cu material layer. Each of the MoNb material layers respectively located on the upper and lower surfaces of the Cu material layer may have a thickness of 100 Å-500 Å to increase the adhesion of the Cu material layer and to prevent oxidation of the Cu material layer, and a thickness of the Cu material layer may be 1 μm to 10 μm.

Figure 4C:
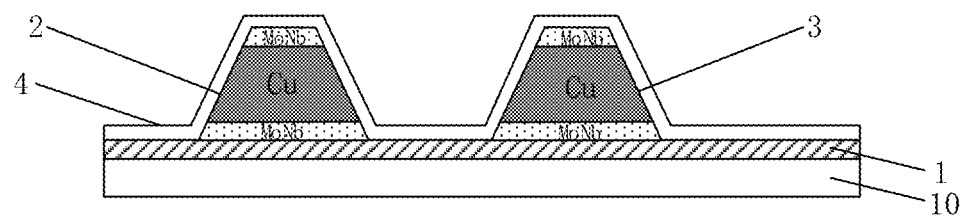
Figure 4D:
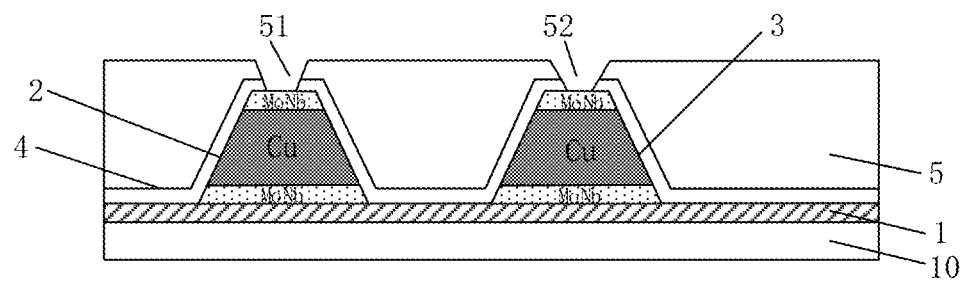

At step S130, after the step S120 is completed, a protection layer 4 and a planarization layer 5 is sequentially formed on the substrate 10, and is etched to form a first via hole 51 penetrating through the protection layer 4 and the planarization layer 5 at a position corresponding to the top of the anode trace 2 and to form a second via hole 52 penetrating through the protection layer 4 and the planarization layer 5 at a position corresponding to the top of the cathode trace 3, as shown in FIGS. 4c-4d.

For example, the protection layer 4 may prevent oxidation of the side surfaces of the anode traces 2 and the cathode traces 3. The material of the protection layer 4 may include silicon nitride (SiNx) with a thickness of 100 Å-1000 Å. The planarization layer 5 may be made of an organic resin material with a thickness of 1 μm to 3 μm. The planarization layer 5 may also be subjected to a carbonization treatment (for example, the surface of the planarization layer 5 is bombarded with an oxygen atmosphere to result in a lighter weight, a better heat resistance, a better insulating properties of the planarization layer 5, and the like). The etching process may be a dry etching process.

Figure 4E:
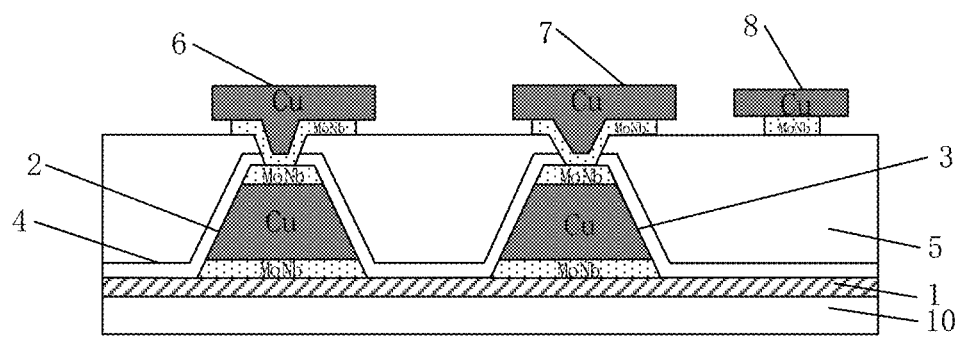

At step S140, after the step S130 is completed, a pattern including an anode connection pad 6, a cathode connection pad 7, and an auxiliary structure 8 is formed on the substrate 10 by a one-step patterning process. The anode connection pad 6, the cathode connection pad 7, and the auxiliary structure 8 each include a first component and a second component in a direction away from the substrate 10, as shown in FIG. 4e.

As described above, two (or more) LED devices arranged adjacently may be connected in series to constitute an LED string. The cathode connection pad 7 of one LED device in an LED string and the anode connection pad 6 of another LED device, which is adjacent to the one LED device, in the LED string may be coupled to each other.

A material of each of the first component of the anode connection pad 6, the first component of the cathode connection pad 7, and the first component of the auxiliary structure 8 may be MoNb, and a material of each of the second component of the anode connection pad 6, the second component of the cathode connection pad 7, and the second component of the auxiliary structure 8 may be Cu.

The step S140 may specifically include: forming a MoNb material layer and a Cu material layer sequentially on the substrate 10, and then the MoNb material layer and the Cu material layer are etched with an etching solution for Ag or an etching solution for Al, so that an orthographic projection of the second component of each of the anode connection pad 6, the cathode connection pad 7, and the auxiliary structure 8 on the substrate 10 covers (e.g., completely covers) an orthographic projection of corresponding first component on the substrate 10. In one embodiment, the first component and the second component of each of the anode connection pad 6, the cathode connection pad 7, and the auxiliary structure 8 may be etched with the etching solution for Ag, so that orthographic projections of the first component and the second component on the substrate 10 almost completely overlap with each other. Then, the first component and the second component of each of the anode connection pad 6, the cathode connection pad 7, and the auxiliary structure 8 are etched with the etching solution for Al to form an undercut (or undercutting) under the second component and on one or more sides of the first component. In other words, an etching rate of the second component by the etching solution for Ag or the etching solution for Al is smaller than that of the first component by the etching solution for Ag or the etching solution for Al. That is, an undercut is formed under the Cu material layer and on one or more sides of the MoNb material layer. Since the anode connection pad 6 and the cathode connection pad 7 function as a bonding structure for an LED device, and the current through the anode connection pad 6 and the cathode connection pad 7 is small, each of the anode connection pad 6 and the cathode connection pad 7 may have a thickness smaller than that of the anode trace 2 or the cathode trace 3, e.g., the Cu material layer of each of the anode connection pad 6 and the cathode connection pad 7 may have a thickness about 2000 Å-6000 Å; a thickness of the MoNb material layer of each of the anode connection pad 6 and the cathode connection pad 7 may be 100 Å-500 Å.

Figure 4F:
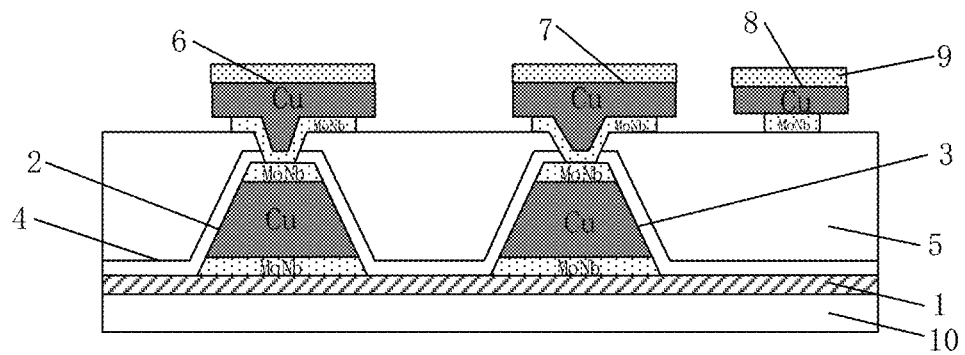

At step S150, after the step S140 is completed, a pattern including a protection electrode 9 is formed on the substrate 10 by a patterning process. The protection electrode 9 covers the anode connection pad 6 and the cathode connection pad 7. A part of the protection electrode 9 on the anode connection pad 6 and a part of the protection electrode 9 on the cathode connection pad 7 are spaced apart from each other, as shown in FIG. 4f. The protection electrode 9 functions to protect the anode connection pad 6 and the cathode connection pad 7 from oxidation. A material of the protection electrode 9 may include a transparent conductive material, such as Indium Tin Oxide (ITO), with a thickness of 200 Å-1000 Å.

It should be noted here that the protection electrode 9 may be formed by one-step patterning process on the anode connection pad 6 and the cathode connection pad 7 in step S140, and may be also formed on the auxiliary structure 8.

Figure 4G:
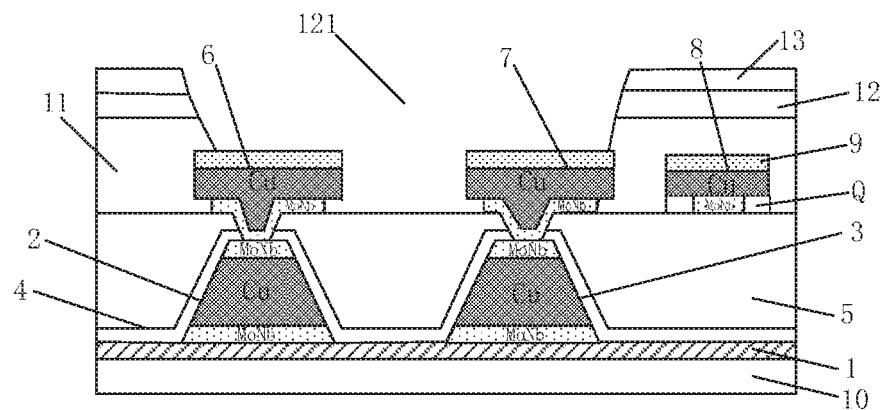

At step S160, after the step S150 is completed, a passivation layer 11 is formed on the substrate 10, and is etched to form an LED accommodating part 121 exposing the anode connection pad 6 and the cathode connection pad 7. In this case, the passivation layer 11, the bottom surface of the second component of the auxiliary structure 8 (the surface proximal to the substrate 10), and the first component of the auxiliary structure 8 define exhaust channel(s) Q, as shown in FIG. 4g, for guiding the gas released by the planarization layer 5 out of the backlight assembly. That is, the exhaust channel(s) Q is (are) formed in this step. As described above, the exhaust channel(s) Q may also be formed below each of the anode connection pad 6 and the cathode connection pad 7.

At step S170, after the step S160 is completed, a pattern including a reflection layer 12 is formed on the substrate 10 by a patterning process, as shown in FIG. 4g. The reflection layer 12 has a first opening at a position corresponding to the LED accommodating part 121. The reflection layer 12 is to reflect light emitted from the LED devices bound to the anode connection pads 6 and the cathode connection pads 7.

The reflection layer 12 may be a composite structure of ITO/Ag/ITO, or may be made of other materials with reflective function, such as Ag.

Figure 5:
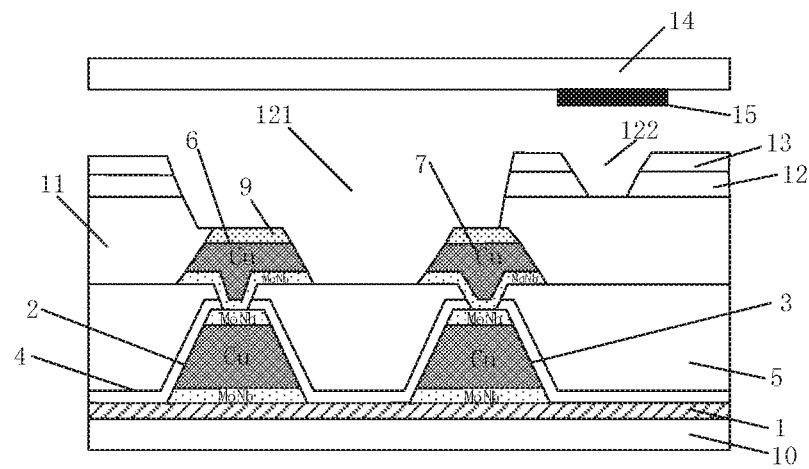
FIG. 5 is a schematic diagram of a structure of a backlight assembly according to an embodiment of the present disclosure.

It should be noted that, in an actual manufacturing process, a patterning process may be used for step S160 and step S170, that is, as shown in FIG. 5, the first opening in the reflection layer 12 is actually a part of the LED accommodating part 121, and a second opening is an opening serving as the exhaust channel Q.

Thus, the backlight assembly of the present embodiment may be manufactured. Optionally, the method for manufacturing the backlight assembly of the present embodiment may further include: forming a first protection layer 4 made of, for example, SiNx on the anode trace 2 and the cathode trace 3 to prevent the anode trace 2 and the cathode trace 3 from being oxidized; and forming a second protection layer 13 made of, for example, SiNx on the reflection layer 12 to prevent the reflection layer 12 from being oxidized; binding the LED devices; and the like.

Since there is (are) exhaust channel(s) Q defined by the passivation layer 11, the bottom surface (the surface proximal to the substrate 10) of the second component of the auxiliary structure 8, the first component of the auxiliary structure 8 on the planarization layer 5 in this embodiment, the gas released by the planarization layer 5 may be guided out of the backlight assembly. In this way, the bulging of the reflection layer 12 can be effectively avoided. Thus, the light reflected by the reflection layer 12 can be uniform, and the light provided by the backlight assembly according to the present embodiment is uniform. As a result, a display device including the backlight assembly can display uniformly.

As shown in FIG. 5, in some embodiments, another backlight assembly is further provided, the structure of which is substantially the same as that of the backlight assembly shown in FIG. 1, except that an auxiliary structure 8 may not be provided in the backlight assembly of this embodiment, and an exhaust channel Q is formed in the reflection layer 12. That is, the reflection layer 12 in the backlight assembly has not only an opening corresponding to the LED accommodating part 121 but also an opening 122 serving as an exhaust channel Q.

Since the reflection layer 12 has the exhaust channel Q therein for releasing the gas accumulated in the planarization layer 5, i.e., for guiding the gas released by the planarization layer 5 out of the backlight assembly, the bulging of the reflection layer 12 can be effectively avoided, so that the light reflected by the reflection layer 12 is uniform, and the light provided by the backlight assembly according to the embodiment is uniform. As a result, a display device including the backlight assembly has uniform display.

Optionally, in the embodiment, the reflection layer 12 may have openings 122 therein uniformly arranged, so that the light emitted from the LED devices is reflected uniformly (i.e., the light emitted by the backlight assembly is uniform).

Figure 6:
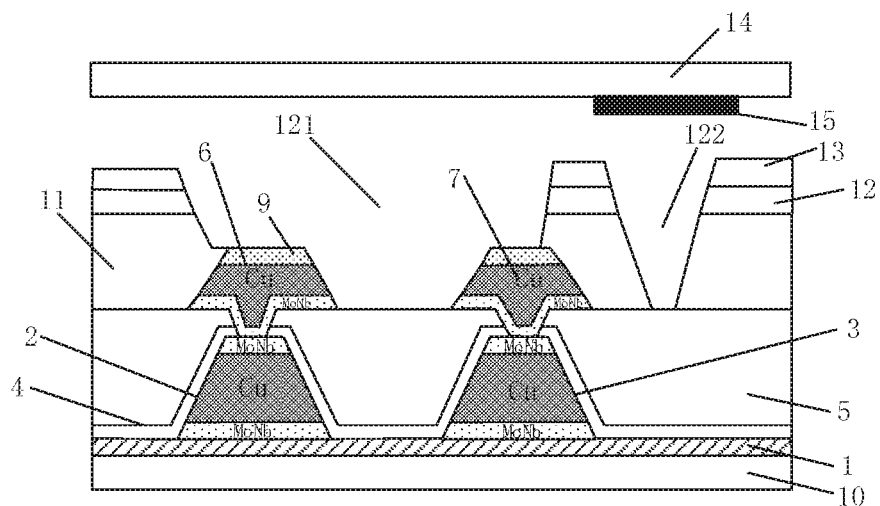
FIG. 6 is a schematic diagram of a structure of a backlight assembly according to an embodiment of the present disclosure.

In addition, as shown in FIG. 6, in some embodiments, each opening 122 serving as the exhaust channel Q may penetrate through not only the reflection layer 12 but also the passivation layer 11, i.e., each opening 122 penetrating through both the reflection layer 12 and the passivation layer 11 may be used as the exhaust channel Q. Thus, the exhaust channel Q can more effectively exhaust (or discharge) the gas generated in the planarization layer 5 out of the backlight assembly.

Correspondingly, in some embodiments, a method for manufacturing the backlight assembly shown in FIGS. 5 and 6 is further provided, and this manufacturing method is substantially the same as the manufacturing method (shown in FIG. 3) in the embodiment shown in FIG. 1, except that the auxiliary structure 8 does not need to be formed in step S140 in the embodiment shown in FIG. 1, and a general etching solution may be used instead of the etching solution for Ag or the etching solution for Al when the anode connection pad 6 and the cathode connection pad 7 are formed in this step. The anode connection pad 6 and the cathode connection pad 7 formed in this way may have a structure of regular trapezoid (i.e., of which the shorter one of the two parallel sides is above the longer one of the two parallel sides).

In step S170 for manufacturing the backlight assembly in the embodiment shown in FIG. 1, masks (gray-scale masks or halftone masks) with different accuracies are used for forming one or more second openings 122 when the LED accommodating parts 121 penetrating through the reflection layer 12 and the passivation layer 11 is formed. The one or more openings 122 serve as one or more exhaust channels Q.

In addition, if each opening 122 penetrates through both the reflection layer 12 and the passivation layer 11, the opening 122 is formed by etching both the reflection layer 12 and the passivation layer 11 to form the exhaust channel Q in step S170, i.e., the LED accommodating part 121 penetrating through the reflection layer 12 and the passivation layer 11 and the opening 122 are formed by a same process in a same step.

In some embodiments, a display device is provided, which includes the backlight assembly provided in any one of the above embodiments and a display panel 14, as shown in FIGS. 5 and 6. The display panel 14 may include a black matrix 15. An orthographic projection of each opening 122 penetrating through both the passivation layer 11 and the reflection layer 12 or an orthographic projection of each opening 122 penetrating through the reflection layer 12 on the display panel 14 may fall into an orthographic projection of the black matrix 15 on the display panel 14, to reduce the display defect due to the opening 122.

Since the display device in the present embodiment includes the backlight assembly provided by any one of the above embodiments, the light from the display device is uniform and the display of the display device is uniform.

For example, the display device may be a liquid crystal display device, such as a liquid crystal panel, a mobile phone, a tablet computer, a television, a display, a notebook computer, a digital photo frame, a navigator, and the like, or may be any product or component with a display function.

It will be understood that the above embodiments are merely exemplary embodiments employed to illustrate the principles of the present disclosure, and the present disclosure is not limited thereto. It will be apparent to one of ordinary skill in the art that various changes and modifications may be made without departing from the scope of the present disclosure as defined in the appended claims, and such changes and modifications also fall within the scope of the present disclosure.

What is claimed is:

1. A backlight assembly, comprising:
a substrate;
an anode trace and a cathode trace of an LED on the substrate;
a planarization layer on a layer where the anode trace and the cathode trace of the LED are located; and
an anode connection pad and a cathode connection pad on the planarization layer,
wherein the anode trace of the LED is coupled to the anode connection pad through a first via hole penetrating through the planarization layer, and the cathode trace of the LED is coupled to the cathode connection pad through a second via hole penetrating through the planarization layer,
wherein an exhaust channel is further arranged on the planarization layer to release gas accumulated in the planarization layer; and
the backlight assembly further comprises:
an auxiliary structure in a layer where the anode connection pad and the cathode connection pad are located, wherein the auxiliary structure comprises a first component and a second component sequentially arranged along a direction away from the substrate, the second component of the auxiliary structure has a bottom surface proximal to the substrate, an orthographic projection of the bottom surface of the second component of the auxiliary structure on the substrate covers an orthographic projection of the first component of the auxiliary structure on the substrate; and
a passivation layer on the layer where the anode connection pad, the cathode connection pad and the auxiliary structure are located, wherein an LED accommodating part is arranged in the passivation layer, and the LED accommodating part exposes the anode connection pad and the cathode connection pad; and the passivation layer, the bottom surface of the second component of the auxiliary structure, and the first component of the auxiliary structure define the exhaust channel.

2. The backlight assembly according to claim 1, wherein the anode connection pad and the cathode connection pad each comprise: a first component and a second component sequentially arranged along a direction away from the substrate,
wherein the first component of the anode connection pad, the first component of the cathode connection pad and the first component of the auxiliary structure are arranged in a same layer and comprise a same material; and
the second component of the anode connection pad, the second component of the cathode connection pad and the second component of the auxiliary structure are arranged in a same layer and comprise a same material.

3. The backlight assembly according to claim 2, wherein a material of the second component of the auxiliary structure comprises Cu, and a material of the first component of the auxiliary structure comprises MoNb.

4. The backlight assembly according to claim 3, comprising a display region and an IC bonding region,
wherein the auxiliary structure is located in the IC bonding region, and the anode connection pad and the cathode connection pad are located in the display region.

5. The backlight assembly according to claim 4, further comprising an LED connection line in a same layer as the anode connection pad, the cathode connection pad and the auxiliary structures, wherein the auxiliary structure do not intersect the LED connection line.

6. The backlight assembly according to claim 1, further comprising a reflection layer on the passivation layer.

7. The backlight assembly according to claim 6, further comprising a second protection layer on the reflection layer.

8. The backlight assembly according to claim 1, further comprising a protection electrode covering a side of the anode connection pad distal to the substrate and a side of cathode connection pad distal to the substrate.

9. The backlight assembly according to claim 1, further comprising a first protection layer between the planarization layer and the layer where the cathode trace and the anode trace are located.

10. The backlight assembly according to claim 1, further comprising a reverse stress layer between the layer where the cathode trace and the anode trace are located and the substrate.

11. The backlight assembly according to claim 1, wherein each of the anode trace and the cathode trace of the LED comprises a first MoNb layer, a Cu layer and a second MoNb layer sequentially arranged on the substrate.

12. The backlight assembly according to claim 1, wherein the first component has a smaller size than the second component in a direction perpendicular to a stacking direction of the first component and the second component.

13. A display device, comprising the backlight assembly according to claim 1 and a display panel, wherein the display panel comprises a black matrix, and an orthogonal projection of an opening penetrating through a passivation layer and a reflection layer or an orthogonal projection of an opening penetrating through a reflection layer on the display panel falls into an orthogonal projection of the black matrix on the display panel.

14. A backlight assembly, comprising:
   a substrate;
   an anode trace and a cathode trace of an LED on the substrate;
   a planarization layer on a layer where the anode trace and the cathode trace of the LED are located; and
   an anode connection pad and a cathode connection pad on the planarization layer,
   wherein the anode trace of the LED is coupled to the anode connection pad through a first via hole penetrating through the planarization layer, and the cathode trace of the LED is coupled to the cathode connection pad through a second via hole penetrating through the planarization layer,
   wherein an exhaust channel is further arranged on the planarization layer to release gas accumulated in the planarization layer; and
   the backlight assembly further comprises a passivation layer on a layer where the anode connection pad and the cathode connection pad are located, and a reflection layer on the passivation layer, and the backlight assembly further comprising an LED accommodating part penetrating through the passivation layer and the reflecting layer, and an opening penetrating through the reflecting layer, wherein the LED accommodating part exposes the anode connection pad and the cathode connection pad; and the opening penetrating through the reflection layer serves as the exhaust channel;
   or
   the backlight assembly further comprises a passivation layer on a layer where the anode connection pad and the cathode connection pad are located, and a reflection layer on the passivation layer; and the backlight assembly further comprising an LED accommodating part and an opening each of which penetrates through the passivation layer and the reflection layer, wherein the LED accommodating part exposes the anode connection pad and the cathode connection pad, and the opening penetrating through the passivation layer and the reflection layer serves as the exhaust channel.

15. The backlight assembly according to claim 14, wherein the opening comprises a plurality of openings which are uniformly arranged.

16. A display device, comprising the backlight assembly according to claim 14 and a display panel, wherein the display panel comprises a black matrix, and an orthogonal projection of an opening penetrating through a passivation layer and a reflection layer or an orthogonal projection of an opening penetrating through a reflection layer on the display panel falls into an orthogonal projection of the black matrix on the display panel.

17. A manufacturing method for a backlight assembly comprising:
   forming a pattern comprising an anode trace and a cathode trace of an LED on a substrate by a patterning process;
   forming a planarization layer on a layer where the anode trace and the cathode trace of the LED are located, and forming a first via hole and a second via hole in the planarization layer;
   forming a pattern comprising an anode connection pad and a cathode connection pad on the planarization layer by a patterning process, wherein the anode trace of the LED is coupled to the anode connection pad through the first via hole penetrating through the planarization layer, and the cathode trace of the LED is coupled to the cathode connection pad through the second via hole penetrating through the planarization layer;
   forming an exhaust channel on the planarization layer to discharge gas accumulated in the planarization layer; and
   wherein an auxiliary structure is further formed at the same time as the anode connection pad and the cathode connection pad are formed, the auxiliary structure comprising a first component and a second component sequentially arranged along a direction away from the substrate, wherein the second component of the auxiliary structure has a bottom surface proximal to the substrate, an orthographic projection of the bottom surface of the second component of the auxiliary structure on the substrate covers an orthographic projection of the first component of the auxiliary structure on the substrate; the method further comprises forming a passivation layer after forming the anode connection pad, the cathode connection pad, and the auxiliary structure, wherein an LED accommodating part is formed in the passivation layer, and the LED accommodating part exposes the anode connection pad and the cathode connection pad; and the passivation layer, the bottom surface of the second component of the auxiliary structure, and the first component of the auxiliary structure define the exhaust channel;
   or
   the manufacturing method, after forming the anode connection pad and cathode connection pad, further comprises:

sequentially forming a passivation layer and a reflection layer; and forming a pattern comprising an LED accommodating part penetrating through the passivation layer and the reflection layer and an opening penetrating through the reflection layer by a one-step patterning process, wherein the LED accommodating part exposes the anode connection pad and the cathode connection pad, and the opening penetrating through the reflection layer serves as the exhaust channel;

or sequentially forming a passivation layer and a reflection layer, and forming a pattern comprising an LED accommodating part and an opening each of which penetrates through the passivation layer and the reflection layer by a one-step patterning process, wherein the LED accommodating part exposes the anode connection pad and the cathode connection pad, and the opening penetrating through the passivation layer and the reflection layer serves as the exhaust channel.

\* \* \* \* \*